United States Patent [19]
Darbee

[11] Patent Number: 5,778,256
[45] Date of Patent: Jul. 7, 1998

[54] PDA HAVING A SEPARATE INFRARED GENERATING DEVICE CONNECTED TO ITS PRINTER PORT FOR CONTROLLING HOME APPLIANCES

[75] Inventor: Paul Vernon Darbee, Santa Ana, Calif.

[73] Assignee: Universal Electronics Inc., Cypress, Calif.

[21] Appl. No.: 707,819

[22] Filed: Sep. 4, 1996

Related U.S. Application Data

[63] Continuation of Ser. No. 37,619, Mar. 24, 1993, abandoned.

[51] Int. Cl.$^6$ .................................................. G06F 13/00
[52] U.S. Cl. .......................... 395/892; 395/882; 395/825; 395/833; 395/280; 341/176; 455/151.2
[58] Field of Search ....................... 395/280, 281, 395/200.01, 887, 893, 892, 882, 825, 833; 364/709.12; 341/176; 455/151.2

[56] References Cited

U.S. PATENT DOCUMENTS

| | | | |
|---|---|---|---|
| 4,200,862 | 4/1980 | Campbell et al. | 340/310 A |
| 4,252,299 | 2/1981 | Eisenburg | 340/825.69 |
| 4,313,227 | 1/1982 | Eder | 359/142 |
| 4,703,450 | 10/1987 | Sueyoshi et al. | 395/892 |
| 4,718,112 | 1/1988 | Shinoda . | |
| 4,856,081 | 8/1989 | Smith . | |
| 4,918,439 | 4/1990 | Wozniak et al. | 340/825.69 |
| 4,959,810 | 9/1990 | Darbee et al. | 395/100 |
| 5,109,222 | 4/1992 | Welty | 340/825.07 |
| 5,204,768 | 4/1993 | Tsakiris et al. | 359/148 |
| 5,220,522 | 6/1993 | Wilson et al. | 340/825.69 |
| 5,227,780 | 7/1993 | Tigwell | 340/825.72 |
| 5,307,173 | 4/1994 | Yven et al. | 358/335 |
| 5,388,216 | 2/1995 | Oh . | |
| 5,490,283 | 2/1996 | Chin | 395/893 |
| 5,579,487 | 11/1996 | Meyerson et al. | 395/280 |
| 5,579,489 | 11/1996 | Dornier et al. | 395/281 |
| 5,600,800 | 2/1997 | Kikinis et al. | 395/281 |
| 5,615,393 | 3/1997 | Kikinis et al. | 395/887 |

OTHER PUBLICATIONS

Electronics Now, "Equipment Reports", Sep. 1988 vol. 59 Issue 9, pages all.
Schilit et al., "The Parctab Mobile Computing System", Workstation Operating Systems, 1993, IEEE/IEE Pubs On Disc.
Proquest Periodical Abstracts, 1992, Access Nos.:00975658, 01211830, 01211826, 01146935.
Computer Select 1989–1990, Doc. #5015, The Computer Conference Analysis Newsletter, Nov. 1990, N. 266, pp. 11–13, "The State of the Art 1995".
"Computer to Wear: PC–Compatible Palm Pad . . . ", San Jose Mercury News (CA), Mar. 19, 1992 p1E, 10E.
"Dress Code: The Ultimate PCs Will Be Worn", OMNI (GOMN) v15, N3, p. 20, A.J.S. Rayl.
"Future Is Now" Broadcast By PBS, Jan. 1992, XEROX's Palo Alto Research Center. Videotape.
Meintz, Sharon; Shaha, Steven; "Our Hand Held Computer Beats Them All", RN vol. 55, Iss. 1, Jan. 1992, pp. 52–57.
Scheier, Robert, "Users Are Already Buying PDAs . . . "Nov. 16, 1992, PC Week, vol. 9, Iss. 46, p. 13.
Scheier, Robert, "PDAs Spell Sea Change for the PC Industry", Nov. 16, 1992, PC Week, vol. 9, Iss. 46, p. 12.
Louderback, Jim, "No Public Displays of Affection Likely for PDA's", Aug. 10, 1992, PC Week, vol. 9, Iss. 32, p. 62.

*Primary Examiner*—Thomas C. Lee
*Assistant Examiner*—Ki S. Kim
*Attorney, Agent, or Firm*—Mark R. Galis; Gary R. Jarosik

[57] ABSTRACT

According to the present invention there is provided an infrared code generating and transmitting device adapted to be coupled to or incorporated in a microcomputer system, commonly referred to as a personal digital assistant (PDA). The IR code generating and transmitting device comprises a CPU separate or incorporated into the microcomputer system of the PDA; a memory separate or incorporated into the microcomputer system; an LED output; LED driver circuitry coupled between the CPU and the LED output; an interface connector; an interface buffer circuit coupled between the interface connector and the CPU; and an interface data buffer circuit coupled by data lines between the interface connector and the CPU.

3 Claims, 7 Drawing Sheets

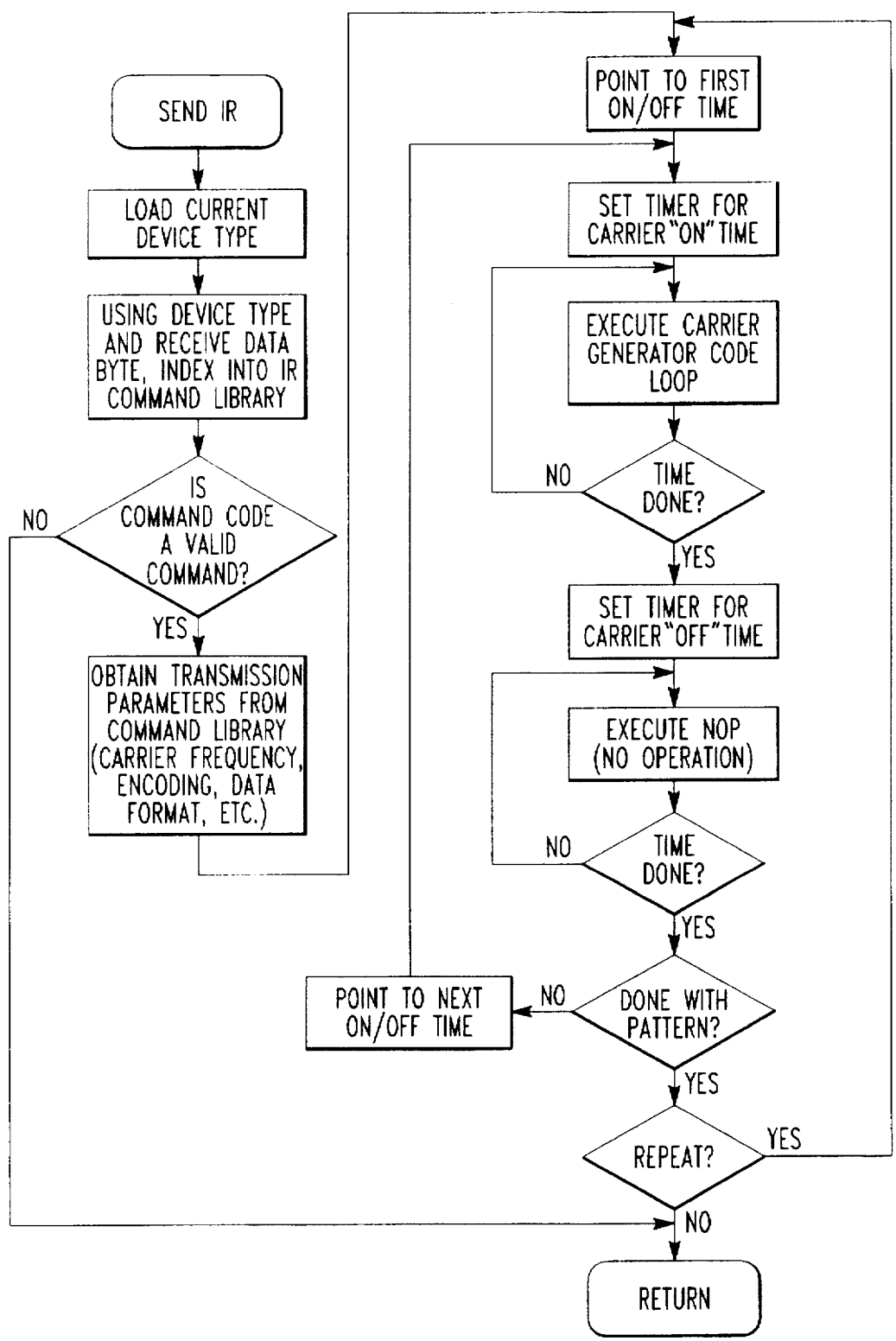
FIG. 6 SEND IR COMMAND

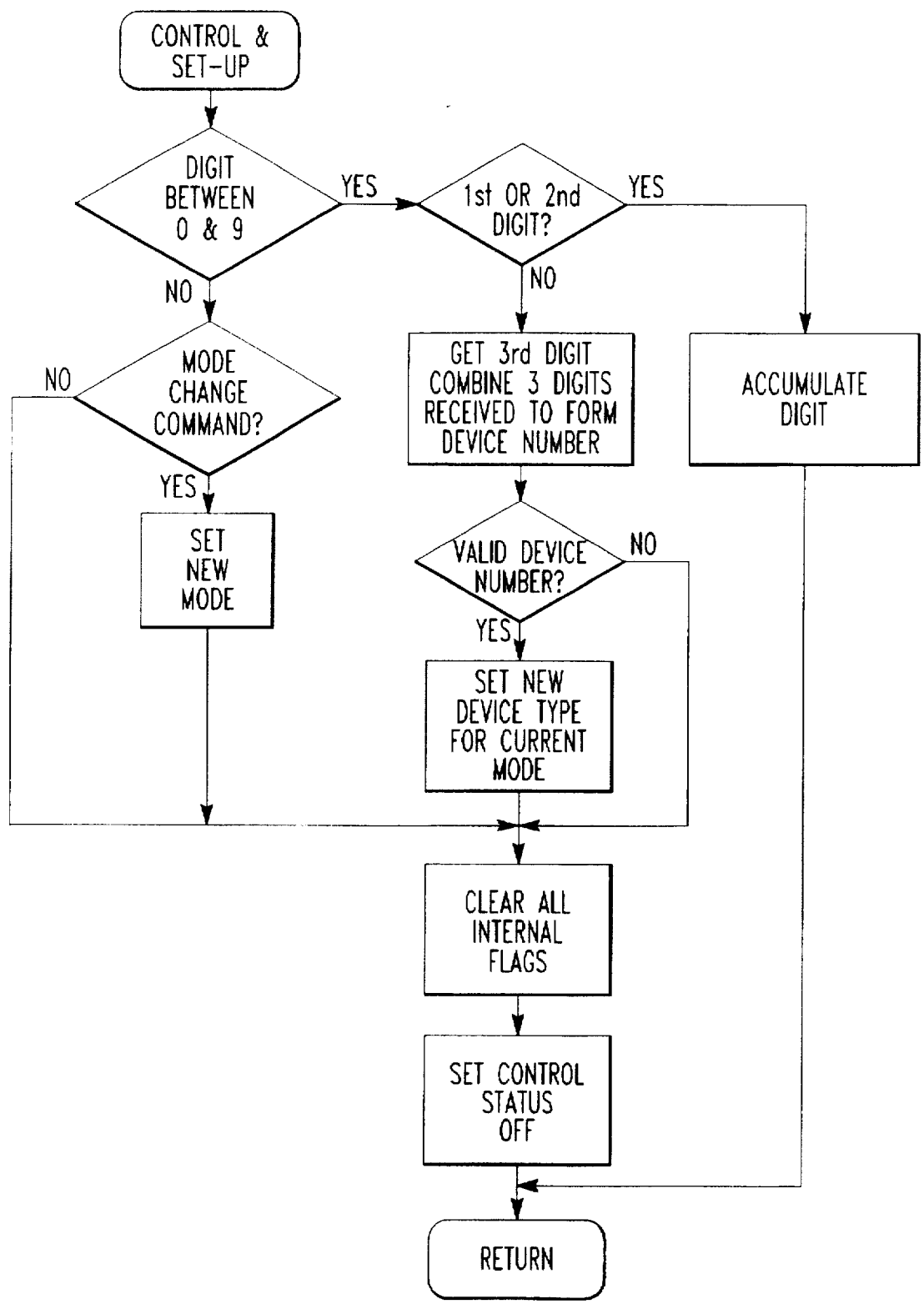
FIG. 7  CONTROL & SET-UP FUNCTIONS

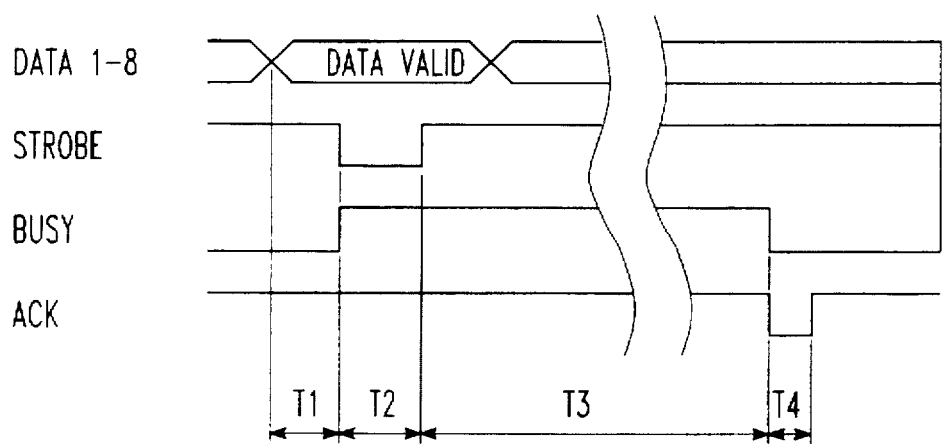

PDA HAVING A SEPARATE INFRARED GENERATING DEVICE CONNECTED TO ITS PRINTER PORT FOR CONTROLLING HOME APPLIANCES

This is a continuation of application Ser. No. 08/037,619 filed Mar. 24, 1993, now abandoned.

BACKGROUND OF THE INVENTION

1. Field of the Invention

The present invention relates to an infrared (IR) code generating and transmitting device attached to or incorporated into a personal digital assistant (PDA) which is a microcomputer system in a hand-held case which typically will have an LCD screen, touch keys on a screen keyboard, and external ports for direct communication to a printer or desktop computer. One of the applications envisioned for a PDA is personal time management, calendar and schedule keeping. The IR code generating and transmitting device of the present invention coupled to or incorporated into a PDA expands the usefulness of the PDA by enabling same to be used for direct remote control of IR activated devices such as video (TV and VCR) and audio (CD and cassette player) equipment as well as IR activated home automation equipment.

2. Description of the Related Art Including Information Disclosed Under 37 CFR §§ 1.97–1.99.

Heretofore, personal digital assistants (PDA's) have been proposed which can have a number of features incorporated into a microcomputer system mounted in the PDA with the casing of the PDA mounting an LCD screen including a digitizer for the capture of pen input. It is contemplated that eventually PDA's will have software and hardware for converting handwriting to ASCII text.

One or more PCMCIA slots can be provided for receiving a PCMCIA card containing customized data such as a local street map. Wireless communication can be provided for communicating via an infrared transmitter, cellular phone or data packet radio whereby E-mail, faxes and voice messages can be downloaded.

An antenna link can be provided in the PDA for communication with a global positioning system. This can help package delivery services track vehicles. A microphone can be built in for voice communication or document annotation.

Additional external ports for direct communication to a printer or desktop computer can be provided.

As will be described in greater detail hereinafter, the IR code generating and transmitting device of the present invention adds another capability to the PDA, namely the activation and control of home video and audio equipment and home automation equipment.

SUMMARY OF THE INVENTION

According to the present invention there is provided an infrared code generating and transmitting device adapted to be coupled to or incorporated in a microcomputer system, commonly referred to as a personal digital assistant (PDA). The IR code generating and transmitting device comprises a CPU separate or incorporated into the microcomputer system of the PDA; a memory separate or incorporated into the microcomputer system; an LED output; LED driver circuitry coupled between the CPU and the LED output; an interface connector; an interface buffer circuit coupled between the interface connector and the CPU; and an interface data buffer circuit coupled by data lines between the interface connector and the CPU.

Also according to the present invention there is provided a method for generating and transmitting an IR command code from a microcomputer of the personal digital assistant (PDA) utilizing the infrared code generating and transmitting device described above, the method comprising the steps of:

verifying that a BUSY signal on a busy line is not true;

placing the desired data bits onto the data lines;

allowing the data signal levels to stabilize;

activating a ~STROBE signal which, when active, is low;

detecting the ~STROBE signal;

inputting the data byte into the CPU;

asserting the BUSY signal to be true until inputting of the data byte has been completed;

releasing the busy line by setting the BUSY signal to be not true; and pulsing or strobing an ~ACK signal on an ~ACK line to indicate that the IR code generating and transmitting device is ready to receive more data.

BRIEF DESCRIPTION OF THE DRAWINGS

FIG. 6 is a block flow diagram of the steps of a routine or protocol followed by the software/program in the infrared generating and transmitting device in carrying out a "SEND IR" command routine.

FIG. 7 is a block flow diagram of the steps of a routine or protocol followed by the software/program in the infrared generating and transmitting device in carrying out a "CONTROL & SET-UP FUNCTIONS" routine.

FIG. 8 is a timing diagram for typical interface timing between the Personal Digital Assistant and the infrared generating and transmitting device.

DESCRIPTION OF THE PREFERRED EMBODIMENT(S)

Figure 1:
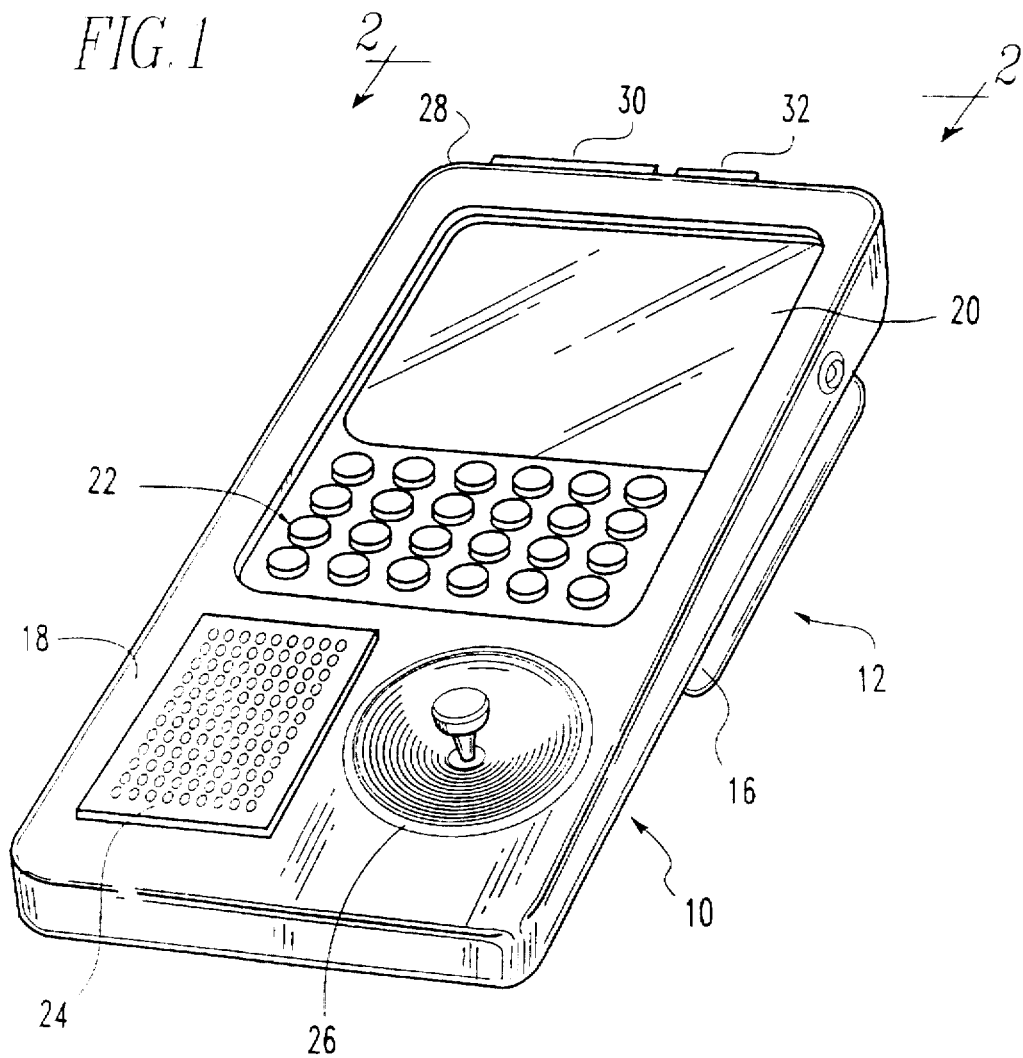
FIG. 1 of the drawings is a perspective view of one embodiment of a Personal Digital Assistant having attached thereto an infrared generating and transmitting device constructed according to the teachings of the present invention and physically and electrically connected to the Personal Digital Assistant.

Referring now the drawings in greater detail, there is illustrated in FIG. 1 a so-called Personal Digital Assistant 10 which is an ultra-miniaturized hand held computer system. One such device is contemplated to be sold by Apple Computer Company under the trademark "NEWTON" and other such devices are sold by Casio Electronics. Similar devices are the Memorex "Commuter Computer", the Psion "Series 3" and the Zeos "Pocket PC".

One of the applications envisioned for such hand held computer systems is personal time management, calendar keeping and schedule keeping.

According to the teachings of the present invention, an infrared generating and transmitting device 12 is attached to (or can be incorporated into) the Personal Digital Assistant (PDA) 10 shown in FIG. 1. The function of such an infrared generating and transmitting device 12 is to enable the PDA to be capable of direct remote control of infrared (IR) operated devices such as video and audio entertainment systems, home automation systems and other IR operated systems.

The technique for the capture, storage and subsequent generation of IR control signals is well known in the art and described in a number of prior patents, such as in the Darbee et al U.S. Pat. No. 4,959,810.

According to the teachings of the present invention, the IR generating and transmitting device 12 and IR generating and transmitting circuitry 14 (FIG. 3) attached to or incorporated into a PDA 10 is provided for use with or in a PDA 10 so that the ultra miniaturized hand held computer system can be used for IR control of various IR controlled systems, such as video and audio equipment including television sets, VCRs, compact disc players, etc.

Referring now to FIG. 1 in greater detail, the PDA 10 has the IR generating and transmitting device 12 fixed to the underside thereof. Electronic IR generating and transmitting circuitry 14 (FIG. 3) is mounted in a casing 16 for the device 12 (or in the PDA 10) The casing 16 has a top panel 18 mounting a visual display or LCD screen 20 having touch sensitive keys 22 thereon. The panel 18 also mounts a speaker 24 and a microphone 26.

One end 28 of the casing 16 has a parallel port 30 and a serial port 32 (FIG. 2) mounted thereon.

Figure 2:
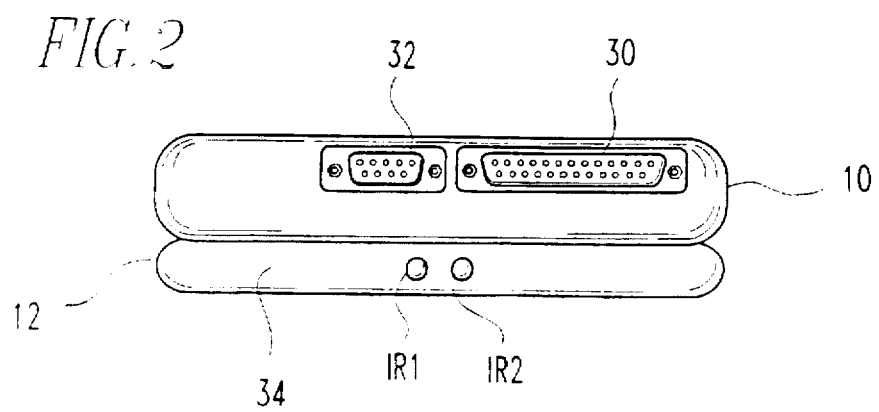
FIG. 2 of the drawings is a front end view of the Personal Digital Assistant and infrared generating and transmitting device shown in FIG. 1 and is taken along line 2—2 of FIG. 1.

As shown in FIG. 2, one end 34 of the IR generating device 12 has two light-emitting diodes (LED's) IR1 and IR2 positioned thereon for emitting coded IR signals. Of course, the LED's IR1 and IR2 can be incorporated into the PDA 10 as well as the IR generating and transmitting circuitry 14 to be described in greater detail hereinafter.

Figure 3:
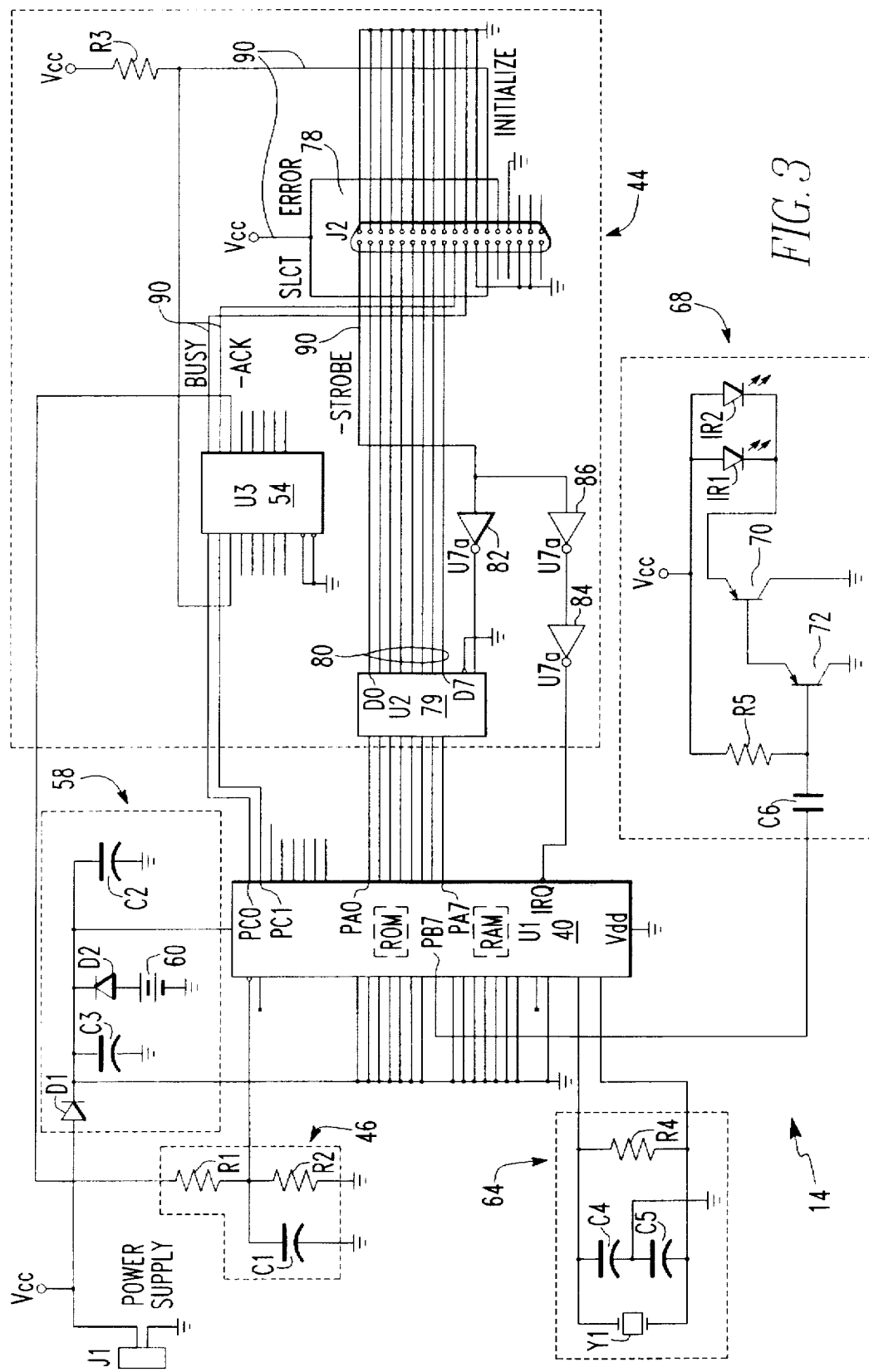
FIG. 3 is a block schematic circuit diagram of the electronic circuitry inside the infrared generating and transmitting device.

As shown in FIG. 3, the IR generating and transmitting device 12 includes the electronic circuitry 14 including a microprocessor 40, including a RAM and a ROM with code therein for generating selected IR control signals on command. The IR LED's IR1 and IR2 are coupled to the microprocessor 40 for transmitting the codes in IR format. A parallel interface 44 is provided which is coupled between the microprocessor 40 and a host microprocessor of the PDA (not shown).

Commands from the host PDA are supplied through the parallel interface 44 to the microprocessor 40. This circuitry enables the infrared generating and transmitting device 12 to be constructed as a separate add-on unit which can be externally attached electrically, for example, to a standard printer port (30 or 32) of the PDA 10.

Of course, the interface 44 can be different, such as, for example, a serial interface for connection to a serial port (32) of a PDA 10; or, as stated above, the interface could be eliminated and the IR LED's IR1 and IR2 can be incorporated as a built in feature of the PDA 10 and the microprocessor of the PDA would also be utilized as the IR microprocessor, either by means of a circuit board plugged into an internal expansion slot, an external expansion slot such as a PCMIA slot, or as an integral part of the main computer board itself. Alternatively, the IR microprocessor 40 can be eliminated entirely and the microprocessor of the PDA can be utilized instead with an IR LED driver attached as a peripheral to the main microprocessor of the PDA which will then directly execute appropriate software to generate the desired IR signal codes.

The electronic circuitry 14 of the IR generating and transmitting device 12 is shown in detail in FIG. 3. Here a voltage divider circuit 46 is provided and includes first and second resistors R1 and R2 which together with a capacitor C1 define the voltage divider 46 and ensure a clean reset signal for the microprocessor 40 whenever power is applied. The voltage divider circuit 46 is coupled to +Vcc through a buffer interface circuit 54 and a and a pull up resistor R3 which permit initiation of the microprocessor 40 reset through the external buffer interface circuit 54 by a signal "INITIALIZE". The steps of the protocol carried out by the software on receipt of the "RESET" command will be described in greater detail in connection with the description of the RESET INITIALIZATION SEQUENCE illustrated in FIG. 4.

A voltage backup and conditioning circuit 58 is provided which conditions the power supplied from both the battery 60 and the power supply g1 to the microprocessor 40. A diode D1 and a capacitor C2 insure a stable supply of voltage from a power supply J1 to the microprocessor 40 even during high current demand cycles which may occur during transmission of IR code signals. A second diode D2, a series connected lithium battery 60, and a parallel connected capacitor C3 provide backup power for maintaining the data in the RAM of the microprocessor 40 when power is withdrawn.

The electronic circuitry 14 further includes an oscillator circuit 64 including a ceramic resonator Y1, a first capacitor C4, a second capacitor C5 and a resistor R5. The oscillator circuit 64 is, in effect, a clock circuit for the microprocessor 40.

An IR driver circuit 68 is coupled to the microprocessor 40, as shown, and includes a first transistor 70 and a second transistor 72 connected as a Darlington Pair for driving the dual IR LEDs IR1 and IR2 under the control of a signal received through a capacitor C6 from output pin PB7 of the microprocessor 40 which changes the voltage drop across a resistor R5 connected between +Vcc and the base of transistor 72.

The software action comprises steps carried by a program stored in the RAM of the microprocessor 40 for initiating and controlling transmission of IR codes will be described in greater detail in connection with the description of the RECEIVE DATA ROUTINE illustrated in FIG. 5 which is the protocol carried out in a SEND IR command.

A 36 pin industry standard interface connector 78 is provided and is often referred to as a "Centronics" interface after the name of the first manufacturer to propose its use.

Connected between the microprocessor 40 and the interface connector 78 is the buffer interface circuit 79 which is a 74LS374 buffer which buffers 8 bits of data received over eight interface lines 80. The data bits present on the input pins D0 through D7 are latched into the buffer interface circuit 79 by an interface signal, -STROBE (after being conditioned by an inverter gate 82). A timing diagram for the typical interface timing is illustrated in FIG. 8 and is described in greater detail in connection with the description of the timing diagram shown in FIG. 8.

An interrupt circuit comprising two inverters 84 and 86 are coupled from the strobe input line 88 to an interrupt input IRQ- of the microprocessor 40. The same interface signal, namely the -STROBE signal after conditioning and a delay through the two inverter gates 84 and 86, which are 74LS04 gates, initiates operation of the microprocessor 40 upon receipt of the data from the buffer interface circuit 79. In this respect, the ~STROBE signal drives the IRQ pin of the microprocessor 40 low thereby generating an interrupt to the operating software of the microprocessor 40. The steps of the program/software entitled RECEIVE DATA that are carried out by the microprocessor 40 upon receipt of the interrupt signal is illustrated in FIG. 5.

The interface buffer circuit 54 is a 74LS244 buffer and is used as a buffer for two outputs from the microprocessor 40, the two output signals being a BUSY signal and an ~ACK signal from the microprocessor 40. The interface buffer circuit 54 also buffers an input signal, INITIALIZE. The relationship of the BUSY and ~ACK signals is illustrated in FIG. 8 and the steps of software or program control thereof, entitled RECEIVE DATE ROUTINE is illustrated in FIG. 5.

The hardware interface between the PDA 10 and the IR generating and transmitting device 12 comprises 8 data lines 80 and 6 control lines 90. The control line INITIALIZE enables the PDA 10 to reset the IR microprocessor 40 to a known state as indicated in FIG. 3. Control lines SLCT and ~ERROR are not used in this application, and are hardwired (to Vcc) to their normal state to ensure compatibility with standard printer interface specifications. Control lines ~STROBE, BUSY, and ~ACK manage the transfer of data across the interface buffer circuit 79 in the following manner with reference to FIG. 7.

The PDA 10, after verifying that the BUSY signal is not true, places the desired data bits for initiating the transmission of the desired IR code signal onto the 8 data lines 80. After a short period of time to allow these signal levels to stabilize, the PDA 10 then activates the ~STROBE signal (note that ~STROBE is active low).

Upon detection of the ~STROBE signal, the microprocessor 40 reads in the 8 bit data byte and asserts the BUSY signal. The BUSY signal remains true until the data byte has been processed (i.e. the function requested has been completed), at which time the microprocessor 40 releases the BUSY signal and pulses ~ACK to indicate that it is ready to receive another byte.

Figure 4:
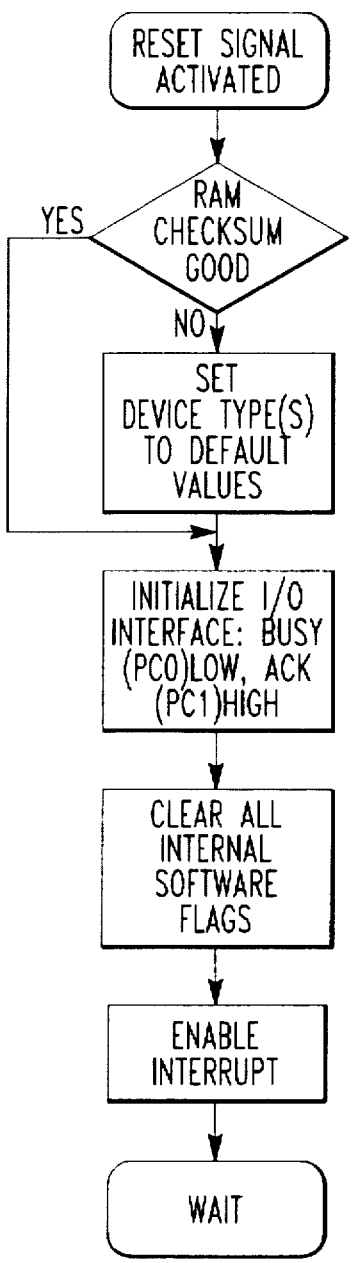
FIG. 4 is a block flow diagram of the steps of a routine or protocol followed by the software/program in the infrared generating and transmitting device when carrying out a "RESET/INITIALIZATION SEQUENCE".

A flow chart of the steps followed by the software in carrying out a RESET/INITIALIZATION SEQUENCE is shown in FIG. 4. After a reset signal has been activated, a ram checksum determination is made to make certain that the default value for the device type(s) are correct. Then the interface I/O line signals are initialized, e.g., a BUSY signal on a PC0 pin of the microprocessor 40 is set low and the ~ACK signal on pin PC1 is set high.

Next all the internal software flags are cleared and the interrupt is enabled.

Figure 5:
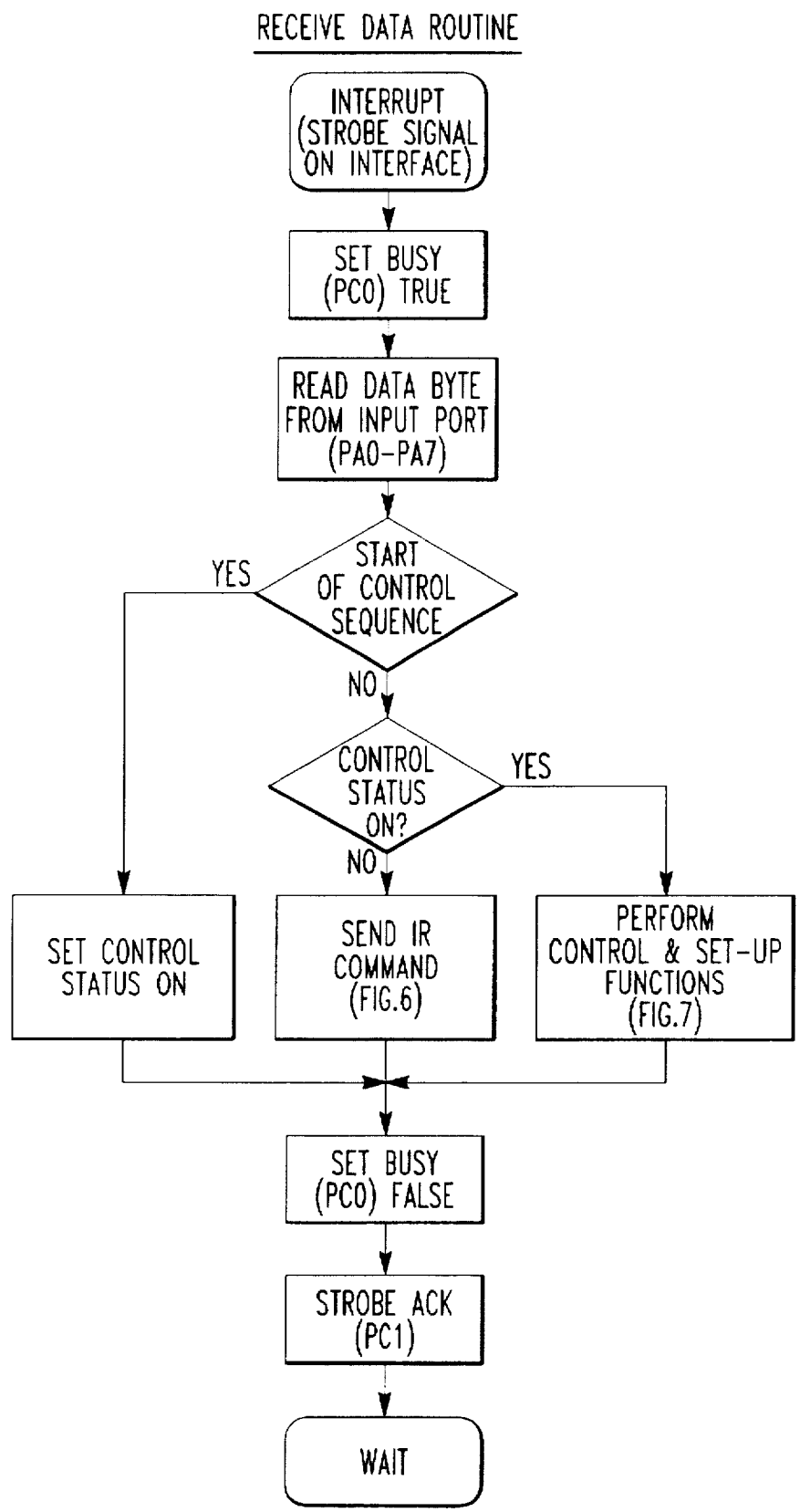
FIG. 5 is a block flow diagram of the steps of a protocol or routine followed by the software/program in the infrared generating and transmitting device in carrying out a "RECEIVE DATA ROUTINE".

In FIG. 5 is illustrated a flow chart of the steps of the software that are carried out in a RECEIVED DATA ROUTINE. Here the interrupt (~STROBE signal) activates the microprocessor 40 to set the BUSY signal on the PC0 pin to be true. Then the data byte from the input lines to pins PA0–PA7 is received.

Next a determination of the start of a control sequence is made so that the control and set up functions can be performed as illustrated in FIG. 7.

If no control status is on, then the IR command is sent as illustrated in FIG. 6.

Next the BUSY signal at the PC0 pin is set FALSE followed by a strobe ~ACK signal being placed on the ACK line at pin PC1.

When the IR generating and transmitting circuitry 14 is attached to the PDA printer port, the PDA 10 can issue two types of commands as illustrated in the flow chart in FIG. 4. Normal operational commands are shown in FIG. 5 and are 1-byte values which cause IR code signals to be transmitted to a target device to be controlled such as a television or VCR. The code signal transmitted in response to a specific byte depends on the particular device type/make/model selected. However, in general, these code signals can be thought of as each byte being the equivalent of a single keystroke on a normal remote control device.

The second class of command signals from the PDA 10 comprise function signals which control the operation and configuration of the microprocessor 40 and generally consist of more than one byte of information. The start of one of these control function transmit sequences is indicated by the receipt of a special (reserved) byte value. This causes the software/program in the microprocessor 40 to set the microprocessor 40 into a "Control Mode" status such that subsequent bytes are interpreted as control functions and not IR commands as illustrated in the flow chart set forth in FIG. 4.

Two types of control functions are currently defined in FIG. 6. The first is a mode change. This specifies the particular class of device (TV, VCR, cable box, CD player, radio receiver, tape deck, etc.) to be controlled by subsequent IR commands. The microprocessor 40 permits multiple modes of classes each with a particular device/make/model assigned to it. This allows rapid switching back and forth between an array of several devices to be controlled.

The second type of control function specifies the particular device make and/or model within the mode (e.g. TV) currently selected. This consists of a 3-digit number which when referenced against a built in code library in the ROM or RAM of the microprocessor 40 and the IR generating and transmitting circuitry 14, uniquely specifies the IR code format for the particular device and the transmission parameters for transmitting a code to the particular device to be controlled.

FIG. 6 is a flow chart of the steps carried out by the software in the microcomputer when it receives a SEND IR command. First, the identity of the current device is loaded. Then, using the device type and the data byte received the microcomputer 40 indexes into an "IR command" library. Next a determination is made if the command is valid. If no, the program exits.

If yes, the transmission parameters are obtained from the library, e.g., carrier frequency encoding data, format, etc.

Then the program points to a first on/off time. Next the time is set for a carrier "ON" time. Then a carrier generator code loop is executed for the "ON" time. Next the timer is set for carrier "OFF" time. Then no operation is executed and a determination if the "ON" time is completed. Then a determination is made if the code pattern has been completed. If not, the program returns to the "point to first on/off time" step. When the pattern is completed, a determination is made if it should be repeated.

FIG. 7 illustrates the steps followed by the software/program in the microcomputer in effecting the CONTROL & SET-UP FUNCTIONS.

In implementing the routine for the CONTROL & SET-UP FUNCTIONS, once a command to control and set-up is determined (see FIG. 5), a determination of a digit number and first or second digit is made. If the digit is not between 0 and 9, a determination is made if a mode change command is being sent via the keyboard 22. If yes, a new mode is set.

After determination of the digits has been completed and it is determined that the digit was not a first or second digit, the third digit is obtained and combined with the other two digits to form a device number. Then a determination is made if it is a valid 3-digit device number. Then the IR generating and transmitting device circuitry 14 is set for the new device type for the current mode followed by clearing of all internal flags and setting of the control status to off.

A typical interface timing diagram is illustrated in FIG. 8 where it can be seen that the ~STROBE signal is initially high and then goes low causing the BUSY signal to go high. Then a data valid check is made and if valid, the function or command is performed after which the BUSY signal goes low and then a strobe ~ACK low signal is transmitted from the pin PC1 through the interface buffer circuit 54 and the interface connector 78 to the PDA 10.

From the foregoing description, it will be apparent that the IR generating and transmitting device 12 of the present invention as an adjunct incorporated into a PDA 10 enhances the value and use of a PDA. More specifically, it enables the PDA 10 to be used as a remote control for controlling IR controlled devices such as for example televisions, VCRs, garage door openers, IR controlled lighting systems, and other IR controlled devices on machines. Also it will be apparent from the foregoing description that modifications can be made to the IR generating and transmitting device 12 of the present invention without departing from the teachings of the invention. Accordingly, the scope of the invention is only to be limited as necessitated by the accompanying claims.

We claim:

1. A microcomputer system of a personal digital assistant (PDA) type comprising:

a portable and hand held unit having a standard printer port;

an infrared device comprising a separate unit which can be mechanically and physically attached to said PDA as an integral part of said system, said infrared device having a communication port which can be electrically connected to said printer port;

wherein said infrared device being operable for generating a plurality of infrared control signals suitable for control of video, home entertainment and home automation systems based upon stored program information; and wherein said infrared device includes signal generating and transmitting circuitry for selectively providing:

a) a one-byte command signal dependant on the particular device to be controlled; and b) a second type of command signal for providing control function comprising more than said one byte signal.

2. A system as in claim 1 wherein:

a) said PDA comprises a flat case;

b) said infrared device comprises a flat case mechanically attached to said PDA case; and c) light emitting diodes are mounted on an end of said infrared device.

3. A system as in claim 2 wherein said infrared device is substantially smaller than said PDA.

* * * * *